US009626335B2

United States Patent
Muldowney et al.

(10) Patent No.: US 9,626,335 B2
(45) Date of Patent: Apr. 18, 2017

(54) FIELD DEVICE INCLUDING A SOFTWARE CONFIGURABLE ANALOG TO DIGITAL CONVERTER SYSTEM

(71) Applicant: Honeywell International Inc., Morristown, NJ (US)

(72) Inventors: Mark L. Muldowney, Chalfont, PA (US); Gary Wilks, Harleysville, PA (US); Yang Wang, Cave Creek, AZ (US)

(73) Assignee: Honeywell International Inc., Morristown, NJ (US)

( * ) Notice: Subject to any disclaimer, the term of this patent is extended or adjusted under 35 U.S.C. 154(b) by 937 days.

(21) Appl. No.: 13/744,106

(22) Filed: Jan. 17, 2013

(65) Prior Publication Data
US 2014/0200850 A1    Jul. 17, 2014

(51) Int. Cl.
| | | |
|---|---|---|
| *H03M 1/00* | (2006.01) | |
| *G06F 17/00* | (2006.01) | |
| *H03M 1/10* | (2006.01) | |
| *H03M 1/06* | (2006.01) | |
| *H03M 1/12* | (2006.01) | |

(52) U.S. Cl.
CPC .......... *G06F 17/00* (2013.01); *H03M 1/0609* (2013.01); *H03M 1/10* (2013.01); *H03M 1/1265* (2013.01); *H03M 1/12* (2013.01)

(58) Field of Classification Search
CPC ................................ G06F 17/00; H03M 1/08
USPC .......................................... 341/118; 702/182
See application file for complete search history.

(56) References Cited

U.S. PATENT DOCUMENTS

| | | | |
|---|---|---|---|
| 5,625,359 A | 4/1997 | Wilson et al. | |
| 5,917,919 A * | 6/1999 | Rosenthal | .......... G10K 11/1786 |
| | | | 381/71.11 |
| 6,005,500 A * | 12/1999 | Gaboury | ................. H03M 3/46 |
| | | | 341/118 |
| 6,496,019 B1 * | 12/2002 | Briefer | ..................... G01L 9/125 |
| | | | 324/207.12 |
| 2005/0071113 A1 | 3/2005 | Heilig | |

(Continued)

FOREIGN PATENT DOCUMENTS

WO        2005071845        8/2005

OTHER PUBLICATIONS

Len Staller, "Understanding analog to digatal converter specifications"; Feb. 24, 2005; http://www.embedded.com/design/configurable-systems/4025078/Understanding-analog-to-digital-converter-specifications, assessed Jan. 19, 2017; pp. 1-12.*

(Continued)

*Primary Examiner* — John Breene
*Assistant Examiner* — Christine Liao
(74) *Attorney, Agent, or Firm* — Jetter & Associates, P.A.

(57) ABSTRACT

A method of analog to digital conversion for a field device having an analog to digital converter system (ADCS) including an ADC and a plurality of filters. An analog sensing signal is received from a sensor which measures a level of a physical parameter in a manufacturing system that runs a physical process. A level of the physical parameter is compared to reference noise data. Based on the comparing, at least one ADCS parameter is determined. The ADCS parameter is implemented to configure the ADCS. The ADCS is utilized with the ADCS parameter to generate a filtered digitized sensing signal from the analog sensing signal.

17 Claims, 4 Drawing Sheets

FIG. 2

(56) References Cited

U.S. PATENT DOCUMENTS

| | | | |
|---|---|---|---|
| 2007/0032971 A1 | 2/2007 | Dutta et al. | |
| 2007/0035314 A1 | 2/2007 | Suntken | |
| 2007/0198219 A1* | 8/2007 | Havela | G01M 13/045 |
| | | | 702/187 |
| 2008/0238717 A1 | 10/2008 | Short et al. | |
| 2010/0117876 A1* | 5/2010 | Cao | H03M 1/1061 |
| | | | 341/118 |
| 2012/0206735 A1* | 8/2012 | Rutten | G01J 1/04 |
| | | | 356/622 |

OTHER PUBLICATIONS

Miro Oljaca and Bonnie Baker; "How the voltage reference affects ADC performance, Part 2"; 2009; Texas Instruments Incorporated; pp. 13-18.*

"Understanding Noise, ENOB, and Effective Resolution in Analog-to-Digital Converters"; May 7, 2012; https://www.maximintegrated.com/en/app-notes/index.mvp/id/5384, assessed Jan. 21, 2017; pp. 1-5.*

Daniel Hostetler, et al., "Adaptive Power Management in Software Radios Using Resolution Adaptive Analog to Digital Converters", Department of Computer Science & Engineering, The Pennsylvania State University, University Park, PA, Proceedings of the IEEE Computer Society Annual Symposium on VLSI, New Frontiers in VLSI Design, 2005.

* cited by examiner

FIG. 1

PRIOR ART

FIELD DEVICE INCLUDING A SOFTWARE CONFIGURABLE ANALOG TO DIGITAL CONVERTER SYSTEM

FIELD

Disclosed embodiments relate to field devices used in manufacturing plants including sensors which measure a physical quantity and analog to digital converter systems for processing the sensor signal.

BACKGROUND

In industrial process control at manufacturing plants, sensors for sensing physical measurements for the process being run (e.g., pressure, temperature, level, or fluid flow) and instruments performing control output actions (e.g., control valves, actuators, or drive units) for the processing units in industrial plants may be located across a large geographic area. These instruments are generally referred to as "field devices" or "field instruments" (hereafter "field devices").

Contemporary field devices are generally termed "smart" field devices because they provide valuable asset data besides the basic sensor or control function for a physical parameter. This asset data relates to the diagnostic health of the field device and the process/application with which it is involved.

Figure 1:
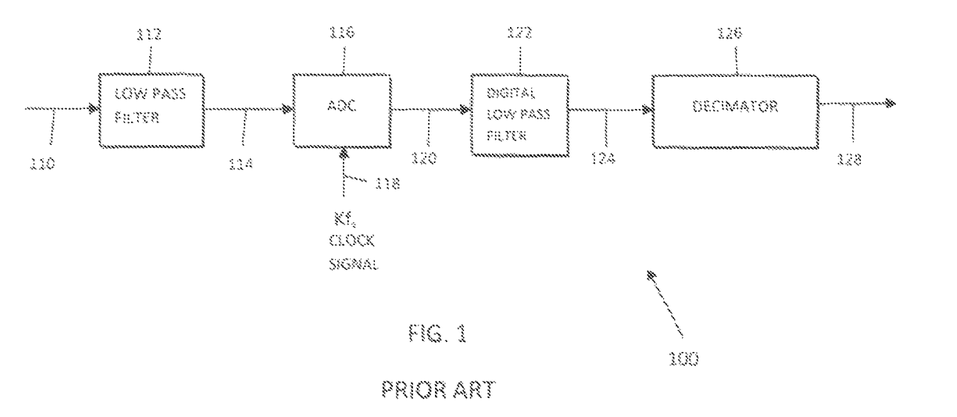
FIG. 1 is a block diagram for a conventional ADCS.

Smart field devices include an analog to digital converter system (ADCS) providing sampling and quantization for converting a continuous analog sensing signal into a discrete-time and discrete-amplitude signal (i.e. a digital signal). FIG. 1 is a block diagram for a conventional ADCS 100 which can be implemented as a sigma-delta ADC, shown receiving an analog input signal on line 110. ADCS 100 includes an analog low-pass (anti-alias) filter 112 which typically has a stop-band frequency equal to $Kf_s/2$ where K is the oversampling ratio of the modulator and $f_s$ is the sample rate at which the ADC 116 operates. The analog input signal on line 110 received by low-pass filter 112 may be output by a sensor which generally provides a transducing function. Low-pass filter 112 implements a portion of a required anti-aliasing function for the ADCS 100. The filtered analog input signal is then provided to the ADC 116 along line 114. The ADC 116 converts the analog signal to a high frequency one-bit digital data stream and also performs noise-shaping on the analog input signal including low-pass filtering the signal of interest and high-pass filtering the quantization noise of the signal. The high frequency data stream output by the ADC 116 is provided on line 120 to digital low pass filter 122.

The clock signal $Kf_s$ shown is received by the ADC 116 on line 118. The sampling rate $f_s$ of the ADC 116 is based on the sample clock which controls when the ADC 116 converts the instantaneous analog voltage to digital values. The sampling rate is the speed at which the ADC 116 converts the input signal after the signal has passed through the analog input path, to digital values.

Digital low-pass filter 122 also performs the anti-aliasing function on the digital data stream output of ADC 116, and generally has sufficient stop-band attenuation at $f_s/2$ to achieve the desired dynamic range. The digital low-pass filter 122 reduces the shaped quantization noise that resides in the upper frequency band. The output samples of the digital low-pass filter 122 are provided on line 124 to a decimator 126 which provides a data rate reduction of the samples to $f_s$. Decimation can be considered a method by which redundant information contained in the digital samples introduced by the oversampling process is removed.

ADCS such as ADCS 100 shown in FIG. 1 are known to tradeoff noise filtering performance with converter speed of response. This tradeoff is usually fixed in the product hardware/firmware at the lowest level of filtering by low pass (anti-alias) filter 112 in an attempt to satisfy the minimum speed of response and maximum tolerable noise.

SUMMARY

This Summary is provided to introduce a brief selection of disclosed concepts in a simplified form that are further described below in the Detailed Description including the drawings provided. This Summary is not intended to limit the claimed subject matter's scope.

Disclosed embodiments recognize for field devices used in industrial (or manufacturing) plants which run a physical process, the approach used by a conventional analog to digital converter system (ADCS) such as ADCS 100 shown in FIG. 1, requires the post-sensor low pass (anti-alias) filter 112 at the input to the ADC 116 to be large enough to ensure acceptably low aliased (false) low frequency noise. In practice, an anti-alias low pass filter 112 with at least 10 dB of attenuation is placed in front of the ADC 116 in the ADCS to prevent noise upstream of the ADC 116 from being aliased back into the ADC's Nyquist band. Disclosed embodiments recognize the high frequency cutoff of this anti-alias low pass filter 112 significantly limits the response speed of ADC system, and thus the response speed of the field device.

Methods of analog to digital conversion for a field device having software for configuring an ADCS which provides balancing of the tradeoff between the ADCS' speed of response and reading stability (i.e. low frequency noise) are disclosed herein. The field device has an ADCS including an ADC and a plurality of filters, and the method includes receiving an analog sensing signal from a sensor which measures a level of a physical parameter in a manufacturing system that runs a physical process. The measured level of the physical parameter is compared to reference noise data. Based on the comparing, at least one ADCS parameter is determined. The ADCS parameter is implemented to configure the ADCS. The ADCS parameter determination and implementing to configure the ADCS and can be automatic based on a processor's execution of disclosed firmware. The ADCS is utilized with the ADCS parameter(s) to generate a filtered digitized sensing signal from the analog sensing signal during operation of the field device.

DETAILED DESCRIPTION

Disclosed embodiments are described with reference to the attached figures, wherein like reference numerals are used throughout the figures to designate similar or equivalent elements. The figures are not drawn to scale and they are provided merely to illustrate certain disclosed aspects. Several disclosed aspects are described below with reference to example applications for illustration. It should be understood that numerous specific details, relationships, and methods are set forth to provide a full understanding of the disclosed embodiments. One having ordinary skill in the relevant art, however, will readily recognize that the subject matter disclosed herein can be practiced without one or more of the specific details or with other methods. In other instances, well-known structures or operations are not shown in detail to avoid obscuring certain aspects. This Disclosure is not limited by the illustrated ordering of acts or events, as some acts may occur in different orders and/or concurrently with other acts or events. Furthermore, not all illustrated acts or events are required to implement a methodology in accordance with the embodiments disclosed herein.

Disclosed embodiments include field devices including disclosed software for configuring an ADCS and methods of digital to analog conversion for a field device having an ADCS. A "field device" as used herein generally includes (i) a sensor for measuring at least one of the plurality of physical process parameters (e.g., pressure, temperature of flow) or (ii) an instrument for performing control output actions (e.g., an actuator) for at least one of the processing units.

Figure 2:
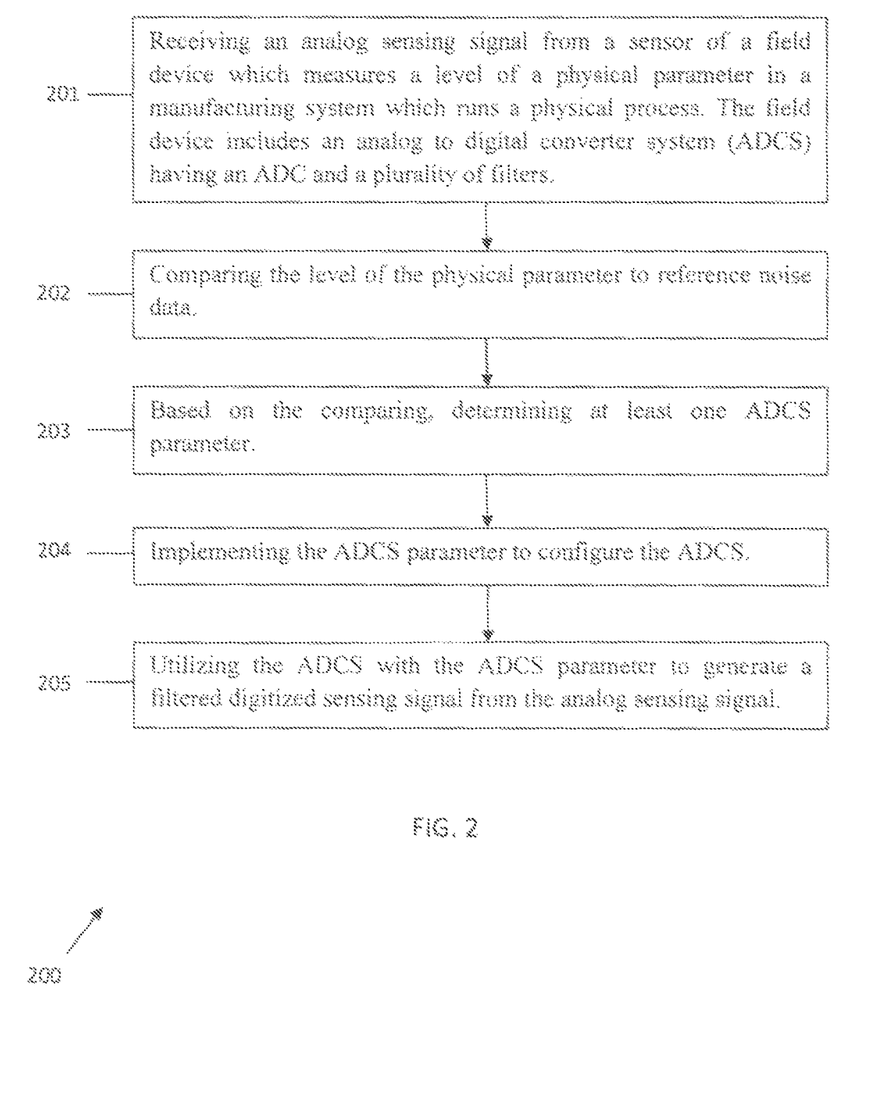
FIG. 2 is a flow chart showing steps in an example method of analog to digital conversion for a field device including a software for configuring an ADCS, according to an example embodiment.

FIG. 2 is a flow chart showing steps in an example method 200 of analog to digital conversion for a field device having an ADCS including an ADC and a plurality of filters, according to an example embodiment. The plurality of filters generally include the filters shown in FIG. 1 comprising the low-pass (anti-alias) filter 112, digital low pass filter 122, and decimator 126. A processor, such as the microprocessor 214 shown in FIGS. 3A and 3B, can programmed to implement the comparing, determining and computations described relative to method 200.

Step 201 comprises receiving an analog sensing signal from a sensor which measures a level of a physical parameter in a manufacturing (or industrial) system which runs a physical process, where the sensor provides an electrical signal output indicative of the level in the form of the analog sensing signal. Example physical parameters that may be sensed include force/pressure, temperature, flow rate, fluid conductivity, and pH.

Step 202 comprises comparing the measured level of the physical parameter to reference noise data. The reference noise data is generally stored in suitable memory (e.g., RAM or ROM) and includes noise within one or more of a level range including the measured signal level, a gain factor range for the ADC, a sample rate range for the ADC, and noise in a plurality of different combinations of values for the plurality of filters. The reference noise data can comprise factory-determined reference noise data obtained exclusively from each ADCS. The reference noise data can be predicted (simulated), interpolated, or obtained from extrapolated data. The comparing can further include considering where the measured level is within a measurement range from a lower range value (LRV) to an upper range value (URV), and can consider the resultant span (URV-LRV) configured for the sensor.

Step 203 comprises determining at least one ADCS parameter for use in updating the ADCS. The ADCS parameter can include a selected sample rate within the sample rate range for the ADC, a selected gain factor within the gain factor range for the ADC, or a selected filter value for at least a first filter of the plurality of filters.

The ADCS parameter can be determined based on one or more predetermined criteria, such as maximizing a speed of a response of the ADCS and minimizing aliasing noise introduced by the ADCS, or noise performance vs. speed of response (or sample rate), or sensor operating range (lower range limit (LRL) to upper range limit (URL)) and signal to noise ratio (SNR). For embodiments using a fixed ADC gain, the ADCS parameter for selection is a sample rate or a filter value. The conversion aperture duration (time) which determines the number of samples that are averaged in a given sample can also be used as a criteria to determine the ADCS parameter. The conversion aperture determines the averaging method for each individual A/D reading that is sent to the processor, such as the microprocessor 214 shown in FIGS. 3A and 3B. The processor can also calculate averages of these averages or standard deviations of these averages, and use these datum as additional criteria for determining the ADCS parameter during normal operation.

Step 204 comprises implementing the ADCS parameter to configure the ADCS. The low pass filter 112 is generally fixed, while the digital low pass filter 122 and decimator 126 can be changed to a selected filter value via programming by disclosed software for configuring an ADCS, and the sample rate for the ADC (set via a clock signal) may also be changed by disclosed software for configuring an ADCS. The determining (step 203) and implementing (step 204) can also both be automatically (adaptively) executed by a processor implementing disclosed software for configuring an ADCS based on criteria noted above. Step 205 comprises utilizing the ADCS with the ADCS parameter selected to generate a filtered digitized sensing signal from the analog sensing signal.

Utilizing an ADCS including disclosed ADCS comprises low pass (anti-alias) filtering the analog sensing signal to generate a filtered analog sensing signal, analog to digital converting the filtered analog sensing signal to generate a digital data stream, and digital filtering of the digital data stream to generate a filtered digitized sensing signal. A low pass filter such as low pass filter 112 shown in FIG. 1 can be used for anti-alias filtering. As noted above, disclosed analog to digital converting allows a smaller (less attenuating) low pass filter to be used as compared to conventional ADC systems. A significantly smaller (less attenuating) anti aliasing filter 112 compared to conventional ADC systems which may be about 10 db, such as 2 to 4 dB can be selected. This advantageously permits higher frequency content to be converted and averaged at higher sample rates to allow the field device to respond faster.

Moreover, with disclosed ADCS parameter updating, high accuracy as well as fast speed of response can be maintained over a wider range of frequencies with less aliasing (false low frequency generation). The sensor software/firmware can also be structured to adjust its signal chain processing speed to match the ADC filtering scheme, based on how the ADCS is currently configured.

The output signal damping algorithm does not have to adjust to any new ADCS filtering scheme, since these changes in front end ADCS operation are isolated from the output processing. Disclosed software for configuring an ADCS can automatically apply more ADC filtering when the device range is small (more noise filtering when signal to noise ratio is low) and less filtering when the device range is closer to the upper range limit (less noise filtering when the signal to noise ratio is high). As described above, automatic selection occurs which would normally be transparent to the end user, but can also be manually selected to permit overriding the automatic behavior.

Figure 3A:
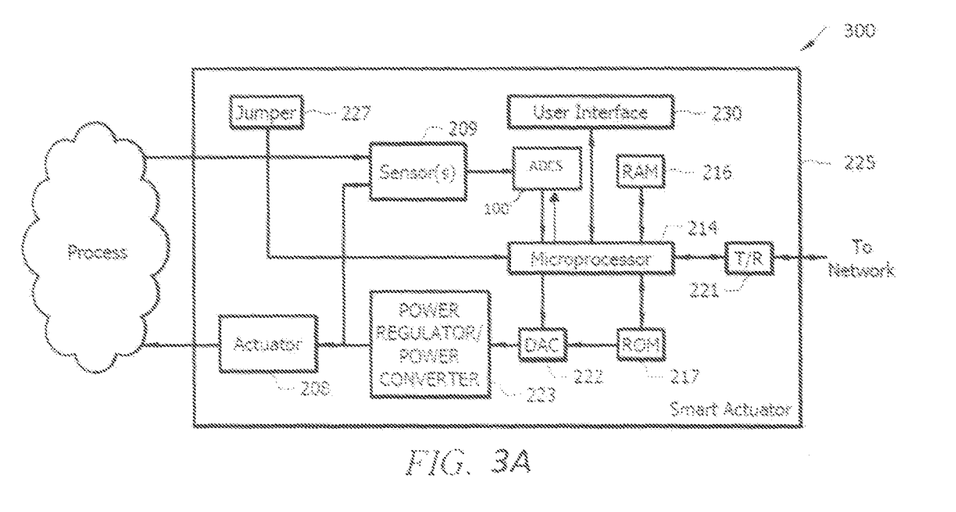
FIG. 3A is a block diagram depiction of an example smart instrument for performing control output actions for processing units shown as a smart actuator having a disclosed software for configuring an ADCS, according to an example embodiment.
Figure 3B:
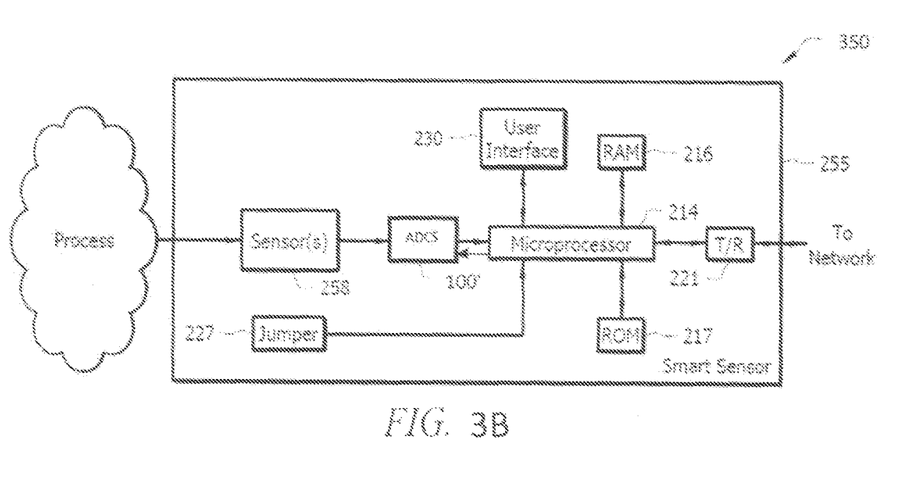
FIG. 3B is a block diagram depiction of an example a smart sensor having disclosed software for configuring an ADCS, according to an example embodiment.

FIG. 3A is a block diagram depiction of an example smart actuator 300 having disclosed software for configuring an ADCS, and FIG. 3B is a block diagram depiction of a smart sensor 350 having disclosed software for configuring an ADCS, according example embodiments. Smart actuator 300 includes a housing 225. Smart actuator 300 is shown including an actuator 208, a sensor 209, and an ADCS shown as 100' being ADCS 100 shown in FIG. 1 with added stored disclosed software for configuring an ADCS.

The output of the ADCS 100' is shown coupled to a processor (or other computing device) shown as a microprocessor 214. Microprocessor 214 includes static random access memory (SRAM shown as RAM) 216 and read only memory (ROM) 217 for memory. The software for configuring an ADCS as well as the reference noise data is generally stored in RAM 216 when RAM 216 comprises a SRAM. Microprocessor 214 is coupled to transmit and receive (T/R) circuitry 221 including a transceiver and optional bus controller which provides communications to and from a network utilized by the industrial (manufacturing) plant.

The output of the microprocessor 214 is coupled to a digital to analog (DAC) converter 222. DAC 222 is coupled to power regulator 223 which is coupled to an input of the actuator 208. Smart actuator 300 includes a user interface 230 that allows user entry of data, including parameters for configuring the ADCS 100'. Smart actuator 300 is also shown including a write protect hardware jumper shown as jumper 227, which is coupled to the microprocessor 214.

The smart sensor 350 shown in FIG. 3B includes a housing 255. Smart sensor 350 is shown including a sensor 258 and ADCS 100'. The output of ADCS 100' is coupled to a processor or computing device shown as a microprocessor 214. Microprocessor 214 includes RAM 216 and ROM 217 for memory. The software for configuring an ADCS as well as the reference noise data is generally stored in RAM 216 when RAM 216 comprises a SRAM. Microprocessor 214 is coupled to T/R circuitry 221 which provides communications to and from a network utilized by the industrial plant. Smart sensor 350 includes a user interface 230 that allows user entry of data, including parameters for configuring the ADCS 100'. Smart sensor 350 is also shown including a write protect hardware jumper 227 which is coupled to the microprocessor 214.

Disclosed field devices can be used for industrial (or manufacturing) plants implementing a wide variety of activities, Such activities include, but are not limited to, oil refining, petrochemicals, central station power generation, fertilizers, pharmaceuticals, food and beverage manufacturing, cement production, steelmaking, papermaking, and gas processing.

Regarding communication protocol, some embodiments may be implemented using HART protocol communications. However, other embodiments can be implemented in WirelessHART, Foundation Fieldbus, PROFIBUS, PROFINET, ISA 100.11a, or any other communication protocol.

Examples

Disclosed embodiments are further illustrated by the following specific Examples, which should not be construed as limiting the scope or content of this Disclosure in any way.

As described above, disclosed embodiments can include automatically comparing operational data to stored factory reference data, that is unique to each ADCS device, which may include one or more of noise vs. gain, noise vs. sample rate, noise vs. input level of a physical quantity, or predicted noise calculated as a function of gain, sample rate and/or input level of a physical quantity. The reference noise value can then be compared to the real time operating pressure of the device in the case of a pressure sensor, and the ADCS' configured range (LRV/URV) to select the best combination of gain and sample rate that maximizes the speed of response and minimizes aliasing noise.

In the case of a pressure sensor, in one particular example, if the interpolated/extrapolated reference noise data at a specific input pressure, gain, and sampling frequency is less than 0.5% of the URV, and increasing the gain will not saturate the ADC input, the gain can be automatically increased by disclosed software for configuring an ADCS. This gain increase can be made without concern for creating unacceptable additional aliased ADC noise, using the same fixed anti-aliasing filter time constant and sampling frequency, thus improving resolution, decreasing noise and maximizing speed of response performance for the ADCS.

While various disclosed embodiments have been described above, it should be understood that they have been presented by way of example only, and not limitation. Numerous changes to the subject matter disclosed herein can be made in accordance with this Disclosure without departing from the spirit or scope of this Disclosure. In addition, while a particular feature may have been disclosed with respect to only one of several implementations, such feature may be combined with one or more other features of the other implementations as may be desired and advantageous for any given or particular application.

Any combination of one or more computer usable or computer readable medium(s) may be utilized. The computer-usable or computer-readable medium may be, for example, but not limited to, an electronic, magnetic, optical, electromagnetic, infrared, or semiconductor system, apparatus, or device. More specific examples (a non-exhaustive list) of the computer-readable medium would include non-transitory media including the following: an electrical connection having one or more wires, a portable computer diskette, a hard disk, a random access memory (RAM), a read-only memory (ROM), an erasable programmable read-only memory (EPROM or Flash memory), a portable compact disc read-only memory (CDROM), an optical storage device, or a magnetic storage device.

The Disclosure is described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a physical computer-readable storage medium that can direct a computer or other programmable data processing apparatus to function in a particular manner, such that the instructions stored in the computer-readable medium produce an article of manufacture including instruction means which implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide processes for implementing the functions/acts specified in the flowchart and/or block diagram block or blocks.

The invention claimed is:

1. A method of analog to digital conversion for a field device, comprising:
   wherein said field device includes a sensor which measures a level of a physical parameter in a manufacturing system that runs a physical process and an analog to digital converter system (ADCS) coupled to an output of said sensor including an ADC and a plurality of filters;
   receiving an analog sensing signal from said sensor which measures said level of said physical parameter;
   comparing said level of said physical parameter to reference noise data, wherein said reference noise data includes factory-determined reference noise data obtained exclusively from said ADC that is unique to said ADCS;
   based on said comparing, determining at least one ADCS parameter,
   implementing said ADCS parameter to configure said ADCS, and
   utilizing said ADCS with said ADCS parameter to generate a filtered digitized sensing signal from said analog sensing signal.

2. The method of claim 1, wherein said reference noise data includes at least one of noise within a level range including said level, noise within a gain factor range for said ADC, noise within a sample rate range for said ADC, and noise for a plurality of different combinations of values for said plurality of filters.

3. The method of claim 2, wherein said ADCS parameter includes at least one of a selected sample rate within said sample rate range for said ADC, a selected gain factor within said gain factor range for said ADC, or a selected filter value for at least a first filter of said plurality of filters from said plurality of different combinations of values.

4. The method of claim 3, wherein said utilizing said ADCS includes:
   anti-alias filtering said analog sensing signal to generate a filtered analog sensing signal;
   analog to digital converting said filtered analog sensing signal to generate a digital data stream, and
   digital filtering said digital data stream to generate said filtered digitized sensing signal,
   wherein said analog to digital converting utilizes said selected sample rate, said selected gain factor, or said digital filtering utilizes said selected filter value.

5. The method of claim 1, wherein said determining and said implementing are automatically executed.

6. The method of claim 1, wherein said physical parameter comprises force/pressure, temperature, flow rate, fluid conductivity, or pH.

7. The method of claim 1, wherein a gain for said ADC for said utilizing said ADCS is held constant.

8. The method of claim 1, wherein said reference noise data includes predicted, interpolated, or extrapolated noise data.

9. The method of claim 1, wherein said determining is based on maximizing a speed of a response of said ADCS and minimizing aliasing noise introduced by said ADCS.

10. A field device, comprising:
    a sensor which measures a level of a physical parameter in a manufacturing system that runs a physical process, said sensor providing an analog sensing signal;
    an analog to digital converter system (ADCS) coupled to receive said analog sensing signal, including:
       an anti-alias filter for filtering said analog sensing signal to generate a filtered analog sensing signal;
       an analog to digital converter (ADC) coupled to receive said filtered analog sensing signal to generate a digital data stream;
       digital filters including a digital low pass filter and a decimator for filtering said digital data stream to generate a filtered digitized sensing signal, and
    a processor having accessible memory storing ADCS configuring code and reference noise data coupled to said ADCS, said processor programmed with said ADCS configuring code programmed for:
       comparing said level of said physical parameter to said reference noise data, wherein said reference noise data includes factory-determined reference noise data obtained exclusively from said ADC;
       determining at least one ADCS parameter, and
       implementing said ADCS parameter to configure said ADCS.

11. The field device of claim 10, wherein said reference noise data includes at least one of noise within a level range including said level, noise within a gain factor range for said ADC, noise within a sample rate range for said ADC, and noise for a plurality of different combinations of values for said digital filters.

12. The field device of claim 11, wherein said ADCS parameter includes at least one of a selected sample rate within said sample rate range for said ADC, a selected gain factor within said gain factor range for said ADC, or a selected filter value for at least a first filter of said digital filters from said plurality of different combinations of values.

13. The field device of claim 10, wherein said determining and said implementing are automatically executed.

14. The field device of claim 10, wherein said sensor comprises a force/pressure sensor, a temperature sensor, a flow rate sensor, a fluid conductivity sensor, or a pH sensor.

15. The field device of claim 10, wherein said determining is based on maximizing a speed of a response of said ADCS and minimizing aliasing noise introduced by said ADCS.

16. A field device, comprising:
    a sensor which measures a level of a physical parameter in a manufacturing system that runs a physical process, said sensor providing an analog sensing signal;
    an analog to digital converter system (ADCS) coupled to receive said analog sensing signal, including:
       an anti-alias filter for filtering said analog sensing signal to generate a filtered analog sensing signal;
       an analog to digital converter (ADC) coupled to receive said filtered analog sensing signal to generate a digital data stream;
       digital filters including a digital low pass filter and a decimator for filtering said digital data stream to generate a filtered digitized sensing signal, and a processor having accessible memory storing ADCS configuring code and reference noise data coupled to said ADCS, wherein said reference noise data includes factory-determined reference noise data obtained exclusively from said ADC, said processor programmed with said ADCS configuring code programmed for:
  comparing said level of said physical parameter to said reference noise data; wherein said reference noise data includes noise within a level range including said level, and at least one of noise within a gain factor range for said ADC, noise within a sample rate range for said ADC, and noise for a plurality of different combinations of values for said digital filters;
  determining at least one ADCS parameter, wherein said ADCS parameter includes at least one of a selected sample rate within said sample rate range for said ADC, a selected gain factor within said gain factor range for said ADC, or a selected filter value for at least one of said digital filters from said plurality of different combinations of values, and
  implementing said ADCS parameter to configure said ADCS,
wherein said reference noise data includes at least one of noise within a level range including said level, noise within said gain factor range for said ADC, noise within said sample rate range for said ADC, and noise for a plurality of different combinations of values for said digital filters.

17. The method of claim 1, utilizing said filtered digitized sensing signal as an input for controlling processing units involved in said physical process.

* * * * *